United States Patent
Yeh et al.

(10) Patent No.: US 9,780,264 B2
(45) Date of Patent: Oct. 3, 2017

(54) LIGHT-EMITTING ELEMENT AND THE MANUFACTURING METHOD OF THE SAME

(71) Applicant: EPISTAR CORPORATION, Hsinchu (TW)

(72) Inventors: Chiao-Wen Yeh, Hsinchu (TW); Hsing-Chao Chen, Hsinchu (TW); Pei-Lun Chien, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/339,579

(22) Filed: Jul. 24, 2014

(65) Prior Publication Data

US 2015/0028374 A1 Jan. 29, 2015

(30) Foreign Application Priority Data

Jul. 24, 2013 (TW) .............................. 102126593 A

(51) Int. Cl.
*H01L 33/00* (2010.01)
*H01L 33/50* (2010.01)
*H01L 33/54* (2010.01)
*G01J 5/60* (2006.01)

(52) U.S. Cl.
CPC .............. *H01L 33/504* (2013.01); *G01J 5/60* (2013.01); *H01L 33/54* (2013.01); *G01J 2005/608* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 6,805,600 | B2* | 10/2004 | Wang | C09K 11/7734 313/502 |
| 2004/0188655 | A1* | 9/2004 | Wu | C09K 11/7774 252/301.36 |
| 2007/0052342 | A1* | 3/2007 | Masuda | C09K 11/0883 313/487 |
| 2008/0211386 | A1* | 9/2008 | Choi | H01L 33/504 313/503 |
| 2008/0265269 | A1* | 10/2008 | Yoo | C09K 11/0883 257/98 |
| 2009/0194781 | A1* | 8/2009 | Harada | C09K 11/025 257/98 |
| 2010/0213821 | A1* | 8/2010 | Masuda | C09K 11/0883 313/501 |

(Continued)

*Primary Examiner* — Ahmed Sefer
(74) *Attorney, Agent, or Firm* — Patterson + Sheridan, LLP

(57) ABSTRACT

The present application discloses a light-emitting element comprising a semiconductor light-emitting stack emitting a first light which has a first color coordinate, a first wavelength conversion material on the semiconductor light-emitting stack converting the first light to emit a second light, and a second wavelength conversion material on the first wavelength conversion material converting the second light to emit a third light. The first light and the second light are mixed to be a fourth light having a second color coordinate. The third light and the fourth light are mixed to be a fifth light having a third color coordinate, and the second color coordinate locates at the top right of the first color coordinate and the third color coordinate locates at the top right of the second color coordinate.

13 Claims, 5 Drawing Sheets

(56) References Cited

U.S. PATENT DOCUMENTS

| | | | | |
|---|---|---|---|---|
| 2012/0132936 A1* | 5/2012 | Yeh | ................... | C09K 11/7715 257/89 |
| 2012/0274240 A1* | 11/2012 | Lee | ................... | H01L 33/0095 315/312 |
| 2013/0009541 A1* | 1/2013 | Zheng | ................ | C09K 11/0883 313/503 |
| 2013/0026500 A1* | 1/2013 | Kim | ........................ | H01L 33/50 257/88 |
| 2013/0264937 A1* | 10/2013 | Sakuta | .................. | H01L 33/504 313/503 |
| 2014/0293608 A1* | 10/2014 | Kanahira | .................. | F21K 9/56 362/293 |

\* cited by examiner

LIGHT-EMITTING ELEMENT AND THE MANUFACTURING METHOD OF THE SAME

CROSS-REFERENCE TO RELATED APPLICATIONS

This application claims priority to and the benefit of Taiwan Application Series Number 102126593 filed on Jul. 24, 2013, which is incorporated by reference in its entirety.

BACKGROUND

Technical Field

The present application discloses a light-emitting element comprising a semiconductor light-emitting stack and a wavelength conversion device to emit a white light.

Description of the Related Art

Following incandescent light, traditional lighting devices have been gradually substituted by solid-state lighting devices consisted of the light-emitting diodes because the light-emitting diodes (LEDs) have the characteristics of low power consumption, environmental protection purpose, long operational life, and small volume. Moreover, the companies are aggressive to develop the LED capable of emitting a white light.

Among the lighting technologies, a white light-emitting diode (WLED) can be realized by a light source comprising a blue light-emitting chip and a red light-emitting chip with a phosphor to emit a yellow light or a green light and be mixed with the light from the chips to form a white light. Or, a blue light-emitting chip as a light source is companied with a phosphor to emit a yellow light or a green light to be mixed with the light from the blue light-emitting chip to form a white light-emitting diode. There are differences such as cost and color temperature between the two types of constructions, but both the two types have a problem of spreading the phosphor. In order to improve characteristics such as color rendering index, light-emitting efficiency and uniformity of the color, many different methods of spreading the phosphor have been applied to improve the uniformity of the color or the amount of light extraction of the WLED.

Among the methods of spreading phosphors, the method of mixing two different phosphors and spreading the mixture is likely to induce absorption. The absorption issue results from the phosphor which emitting a light of a longer wavelength is more likely to absorb the light of shorter wavelength emitted by another phosphor, which is one of the reasons that the light-emitting efficiency of a white light is lower.

The light-emitting diode comprising above phosphors can be further connected to other components to form a light-emitting apparatus. The light-emitting apparatus comprises one sub-mount having one circuit, one solder on the sub-mount which fixes the light-emitting diode on the sub-mount and forms an electrical connection between the circuit on the sub-mount and the light-emitting diode, and an electrical connection element to electrically connects the electrode of the light-emitting diode and the circuit on the sub-mount, wherein the sub-mount can be a lead frame or a large size mounting substrate for the convenience of designing the circuit of a light-emitting apparatus and improve the effect of heat dissipation.

SUMMARY OF THE DISCLOSURE

A light-emitting element, comprises a semiconductor light-emitting stack emitting a first light, a first wavelength conversion material on the semiconductor light-emitting stack converting the first light to emit a second light, and a second wavelength conversion material on the first wavelength conversion material converting the second light to emit a third light, wherein the first light has a first chromaticity coordinate. The first light and the first second light are mixed to be a fourth light having a second chromaticity coordinate. The third light and the fourth light are mixed to be a fifth light having a third chromaticity coordinate. The second chromaticity coordinate locates at the top right of the first chromaticity coordinate and the third chromaticity coordinate locates at the top right of the second chromaticity coordinate.

A method of manufacturing a light-emitting element comprises providing a semiconductor light-emitting stack emitting a first light, forming a first wavelength conversion material on the semiconductor light-emitting stack, and forming a second wavelength conversion material on the first wavelength conversion material. The first light has a first chromaticity coordinate. The first wavelength conversion material converts the first light to emit a second light, and the second wavelength conversion material converts the first light to emit a third light. The first light and the second light are mixed to be a fourth light having a second chromaticity coordinate. The third light and the fourth light are mixed to be a fifth light having a third chromaticity coordinate. The second chromaticity coordinate locates at the top right of the first chromaticity coordinate and the third chromaticity coordinate locates at the top right of the second chromaticity coordinate.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
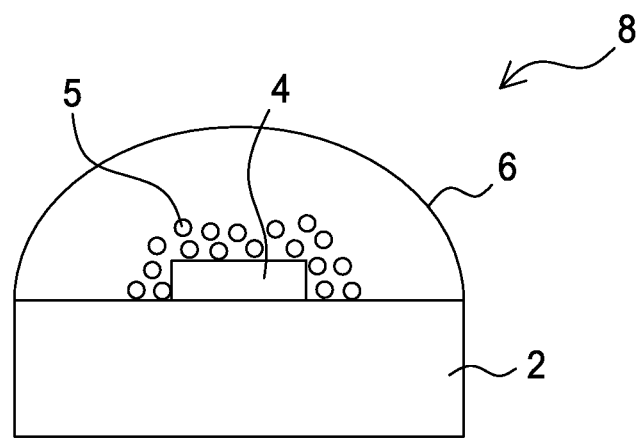
FIGS. 1a-1b shows a light-emitting element in accordance with an embodiment of the present disclosure.

FIG. 1a shows a light-emitting element in accordance with an embodiment of the present disclosure. The light-emitting element 8 comprises an LED chip 4 on a substrate 2, a wavelength conversion device 5 on the LED chip 4, and a first optical element 6 covering the LED chip 4 and the substrate 2. The LED chip 4 comprises a semiconductor light-emitting stack, and the substrate 2 comprises a circuit formed thereon and electrically connected to the LED chip 4. Or, the substrate is composed of a material with good thermal conductivity, such as metal or ceramic having a heat conductivity larger than 30 (W/m° C.), so the substrate 2 has good thermal conductivity to provide a heat dissipation path for the LED chip 4. The first optical element 6 comprises a material which is transparent to the light emitted by the LED chip 4 and is transparent to the light emitted by the wavelength conversion device 5. The first optical element 6 can be a lens of different shape to change the light field of the light emitted by the light-emitting element 8. The wavelength conversion device 5 between the LED chip 4 and the first optical element 6 is configured to change the wavelength of the light emitted by the LED chip 4 so the converted light and the light emitted by the LED chip 4 are mixed to be a white light, wherein the wavelength conversion device 5 comprises one wavelength conversion material, such as phosphor.

Figure 1B:
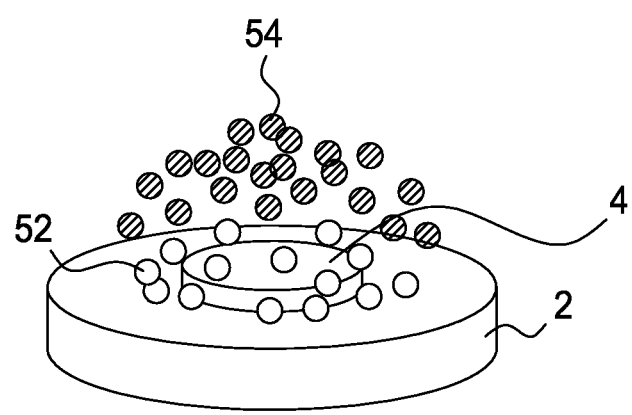

FIG. 1b shows a wavelength conversion device 5 and an LED chip 4 in accordance with an embodiment of the present disclosure. The LED chip 4 locates on the substrate 2 and is covered by the wavelength conversion device 5 composed of a first phosphor 52 and a second phosphor 54. The first phosphor 52 absorbs the first light emitted by the LED chip 4 to emit a second light, and the second phosphor 54 absorbs the first light emitted by the LED chip 4 to emit a third light. The wavelength of the second light is larger than that of the third light, and the wavelength of the third light is larger than that of the first light. In an embodiment, the first light has a dominate wavelength within the wavelength range of a blue light, the second light has a dominate wavelength within the wavelength range of a red light, and the third light has a dominate wavelength within the wavelength range of a green light or yellow light. To be more specific, the first light has a dominate wavelength between 450~490 nm, the second light has a dominate wavelength between 620~650 nm and the third light has a dominate wavelength between 500~570 nm.

Referring to the embodiment in accordance with the presented application shown in FIG.1b, the method of manufacturing comprising the following steps:
1. Respectively weighting the first phosphor 52 and the second phosphor 54, and mixing the two phosphors with colloids respectively to form a first mixture and a second mixture;
2. Stirring the first mixture and the second mixture to uniformly spread the phosphor in the corresponding colloid, and covering the first mixture which comprises the first phosphor 52 on the LED chip 4;
3. Baking the LED chip 4 which is covered by the first mixture to fix the first mixture on the LED chip 4. Then, covering the first mixture with the second mixture which comprises the second phosphor 54;
4. Baking the LED chip 4 so the second mixture is fixed on the LED chip 4. In the above steps, the colloid is transparent to the light emitted by the LED chip 4 so the light from LED chip 4 is absorbed by the colloid as few as possible and is absorbed by the first phosphor 52 and the second phosphor 54 to generate the second light and the third light. In the above steps, covering the first mixture and the second mixture can be performed in one step or multiple steps. That is, multiple layers of the first mixture or multiple layers of the second mixture can be formed on the LED chip 4. In this embodiment, the material of the colloid can be a mixture of silica and n-heptane. The first mixture and the second mixture are located on the LED chip 4 in a coverage form. The first phosphor 52 and the second phosphor 54 in the mixtures can be uniformly spread around the LED chip 4. Or, the first phosphor 52 and the second phosphor 54 phosphor can be intensively formed on a part of the surface of the LED chip 4, such that the part of the surface has a higher density of phosphor than the rest part of the surface. The method of forming the first mixture and the second mixture on the surface comprises spraying and dispensing. In this embodiment, the first phosphor 52 is a red phosphor and the second phosphor 54 is a yellow-green phosphor. Such that, the first phosphor 52 absorbs a light to emit a second light of red color, and the second phosphor 52 absorbs a light to emit a third light of yellow-green color. To be specific, the first phosphor 52 is $(SrCa)AlSiN_3:Eu$ and the second phosphor 54 is YAG:Ce. After performing the steps above, the light emitted from the LED chip 4, the red light emitted by the first phosphor 52 and the yellow-green light emitted by the second phosphor 54 are mixed to form a white light having a specific color temperature or having a chromaticity coordinate within a specific range.

In the embodiment with respect to this application, adjustment procedures are applied in order to form a white light having a specific color temperature or a chromaticity coordinate within a specific range. First, to adjust the amount of the red phosphor applied while covering the red phosphor on the LED chip 4 so the second light emitted from the red phosphor is mixed with the first light from the LED chip 4 to form a fourth light having a second chromaticity coordinate, wherein the second chromaticity coordinate locates at the top right of the first chromaticity coordinate and locates within a specific range. In order to adjust the amount of the red phosphor on the LED chip 4 to restrict the second chromaticity coordinate within a specific range, the step of forming the mixture comprising red phosphor on the LED chip 4 can be a one-step or a multi-step process. Then, yellow-green phosphor on the LED chip 4 absorbs a first light from the first chip 4 and emits a third light. The third light and the fourth light are mixed to be a fifth light having a third chromaticity coordinate located at the top right of the second chromaticity coordinate, and the third chromaticity coordinate locates within a specific range. In this embodiment, the fifth light is a white light. Similarly, in order to restrict the third chromaticity coordinate within a specific range, the step of covering the mixture containing the yellow-green phosphor on the LED chip 4 can be a one-step or a multi-step process. Moreover, the yellow-green phosphor is selected according to the relationship between the second chromaticity coordinate and the third chromaticity coordinate to be excited to emit a proper yellow-green light. Then, the amount of the yellow-green phosphor is adjusted before being placed on the LED chip 4 in order to form a fifth light having a third chromaticity coordinate located within a predetermined range.

As mentioned above, in this application, the amount of the phosphor which emits a light having a longer wavelength is adjusted first. Thus, the light mixed by a light from LED chip and the light from the phosphor has a chromaticity coordinate locates within a specific range. The phosphor of the two phosphors which has shorter wavelength is then applied to cover the LED chip. Such that, the light from LED, the light from the phosphor having longer wavelength, and the light from the phosphor having shorter wavelength are mixed to form a light having a chromaticity coordinate within a specific range, that is, within a predetermined range. With the procedure of covering a phosphor with longer wavelength before covering a phosphor with shorter wavelength, the light emitted from the phosphor having a shorter wavelength is prevented from being absorbed by the phosphor having a longer wavelength. So, the light-emitting efficiency of the light-emitting device is improved. Besides, since the amount of light having shorter wavelength absorbed by the phosphor having longer wavelength is decreased, the amount of the phosphor having shorter wavelength needed is decreased. The method of covering phosphors comprises a method of covering the phosphors by layers to decrease the amount of phosphor by a multi-step covering process. Therefore, not only the amount of phosphor applied is decreased, but also the brightness of the light-emitting element is increased and the cost is reduced. In the above steps, a difference of slopes between the second chromaticity coordinate and the third chromaticity coordinate is estimated before spreading the phosphor for the second time. Then, the proper yellow-green phosphor is provided to be spread on the LED chip in one step or multiple steps so the third chromaticity coordinate of the fifth light is much accurately derived.

Figure 2A:
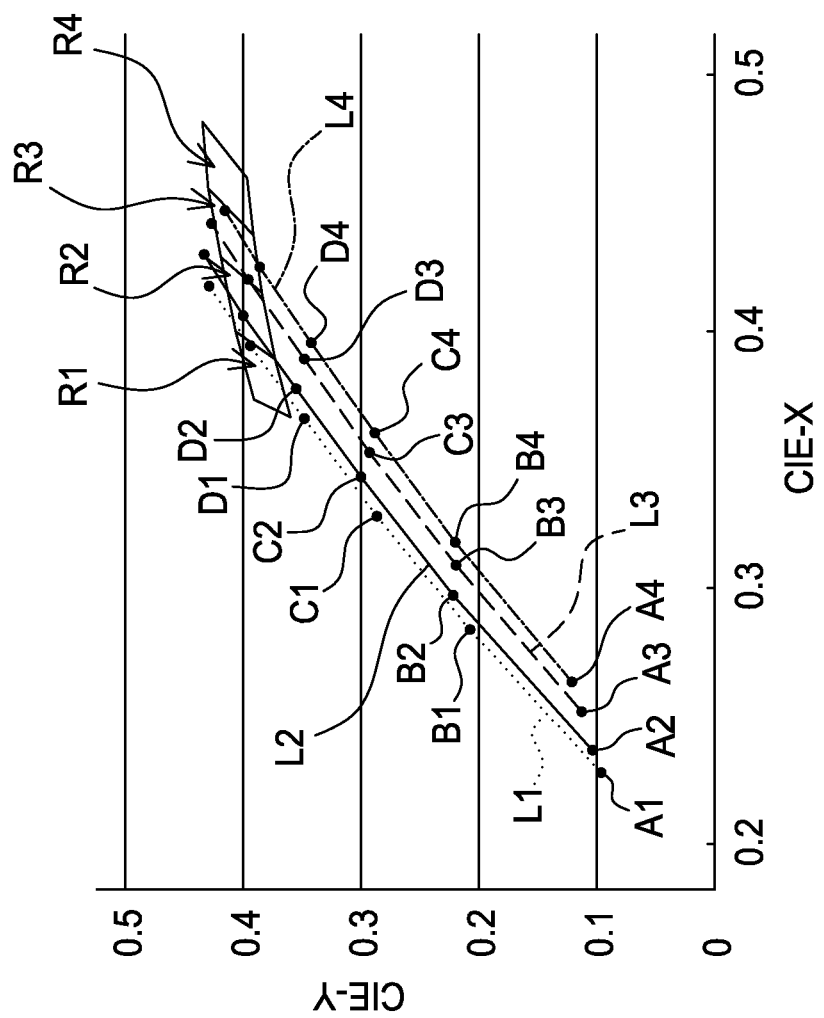
FIGS. 2a-2c show chromaticity coordinate figures in accordance with an embodiment of the present disclosure.

FIG. 2a shows a chromaticity coordinate of a light emitted from the phosphor excited by the LED chip disclosed in an embodiment of this application. In this embodiment, the red phosphor comprises $(SrCa)AlSiN_3$:Eu and the yellow-green phosphor comprises YAG:Ce, and the phosphors are spread on the LED chip emitting a light having a wavelength of 452 nm following out the above steps. As shown in FIG. 2a, the chromaticity coordinates A1~A4 of four fourth lights are formed by mixing a first light (blue light) and a second light (red light). The difference between the four chromaticity coordinates results from different amount of the red phosphor on the LED chip and different wavelength of the first light from different LED chip samples. In this embodiment, the red phosphor emits a red light having a dominate wavelength of 625 nm and the LED chip emits a blue light having a dominate wavelength of 452 nm. Similar to the previous steps, the amount of the yellow-green phosphor on the LED chip can be adjusted after the fourth light is generated so the chromaticity coordinates A1~A4 are moved to the regions R1~R3 along the curves L1~L4, wherein the yellow-green phosphor emits a yellow-green light having a dominate wavelength of 539 nm. As depicted in FIG. 2a, the chromaticity coordinates A1~A4 move to the region R1~R3 along the curves L1~L4 and passes the chromaticity coordinates B1~B4, C1~C4 and D1~D4, which indicates the light-emitting element in this embodiment emits a white light having a chromaticity coordinate within regions R1~R3 by spreading yellow-green phosphor three times. In this embodiment, for the white light having a chromaticity coordinate within regions R1~R3, the chromaticity coordinates A1~A4 of the fourth light mixed by red light and blue light is determined first, and the yellow-green phosphor is spread according to the chromaticity coordinates A1~A4 for one time or multiple times to reach the desired chromaticity coordinate region. Accordingly, the amount of phosphors used during the change of chromaticity coordinates is decreased. In another embodiment, the amount of the phosphor applied can be referred to the red phosphor and the yellow-green phosphor used in the embodiment depicted in FIG. 2a. Then, the phosphors can be spread on the LED chip to generate a white light (fourth light) having a chromaticity coordinate within regions R1~R3. Moreover, the white light having a fifth chromaticity coordinate has a color temperature between 2700K~6500K.

Figure 2B:
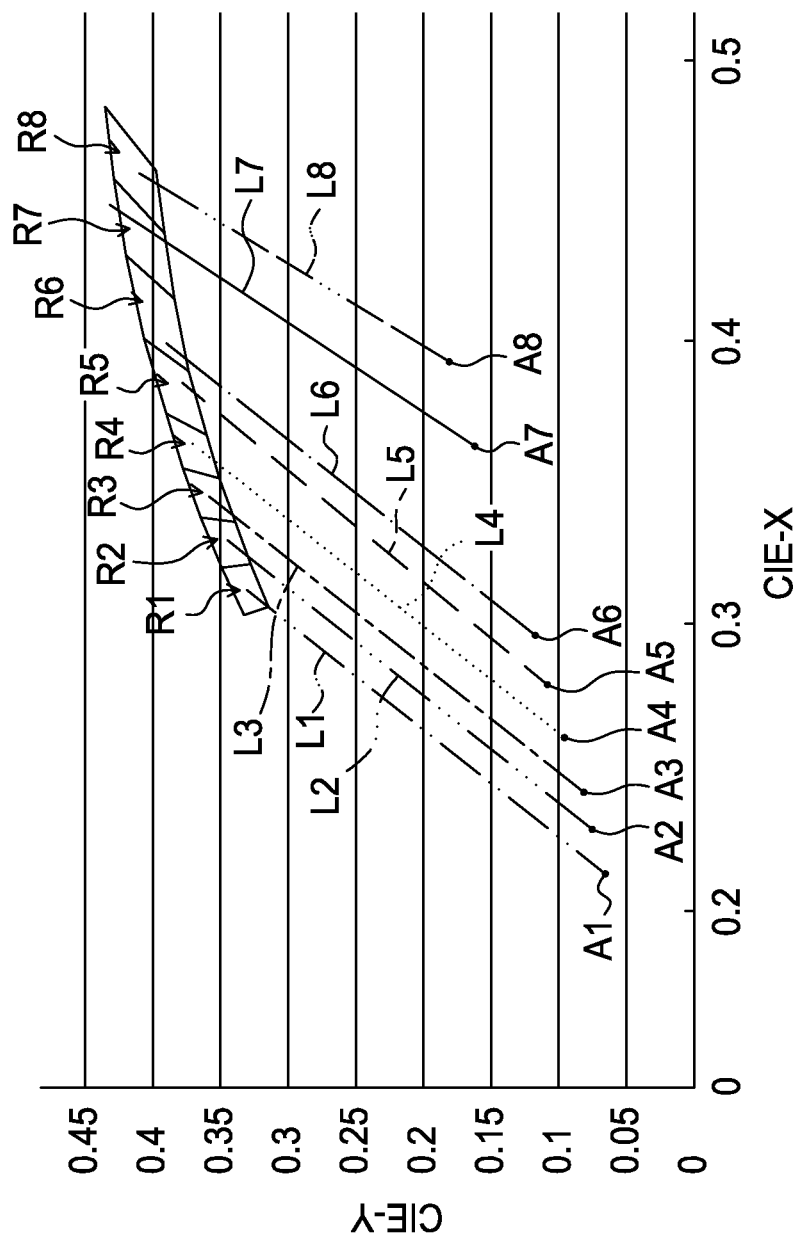

FIG. 2b shows a chromaticity coordinate of a light emitted from the phosphor excited by the LED chip disclosed in an embodiment of this application. In this embodiment, the red phosphor comprises $(SrCa)AlSiN_3$:Eu and the yellow-green phosphor comprises YAG:Ce, and the phosphors are spread on the LED chip emitting a light having a wavelength of 452 nm. As shown in FIG. 2b, the eight fourth lights of different samples have chromaticity coordinates A1~A8, and the fourth lights are respectively mixed by a first light (blue light) and a second light (red light). The difference between the eight chromaticity coordinates results from different amount of the red phosphor spread on the LED chip and different wavelengths of the first lights of different samples.

In this embodiment, the red phosphor emits a red light having a dominate wavelength of 640 nm and the LED chip emits a blue light having a dominate wavelength of 452 nm. As the steps depicted above, the amount of the yellow-green phosphor on the LED chip is adjusted after the chromaticity coordinates A1~A8 are generated so the chromaticity coordinates A1~A8 are moved to the regions R1~R8 along the curves L1~L8, wherein the yellow-green phosphor emits a yellow-green light having a dominate wavelength of 539 nm. As shown in FIG. 2b, since the phosphors are spread in a one-step method like dispensing, with respect to the change of the chromaticity coordinates, when the chromaticity coordinates A1~A8 are moved to regions R1~R8, no other chromaticity coordinates such as B1~B8, C1~C8 or D1~D8 resulted from spreading phosphors in multiple steps are recorded, and only the original chromaticity coordinates A1~A8 and the regions R1~R8 are recorded. In this embodiment, the white light having chromaticity coordinates within the region R1~R8 is formed by following steps of : (1) deciding the chromaticity coordinates A1~A8 of the fourth light mixed by a red light and a blue light; and (2) spreading the yellow-green phosphors to cover the LED chip based on the chromaticity coordinates A1~A8 to form the white lights; so that the chromaticity coordinates of the white light locate in the predetermined chromaticity coordinate regions. Besides, the white light in this embodiment has a color temperature between 2700K~6500K.

In the embodiments above, the phosphors are substantially covering the areas of the LED chip uniformly. In another embodiment, the phosphors are spread according to the locations on the LED chip, and some of the regions on the surfaces are covered by more phosphor than other regions are covered.

Figure 2C:
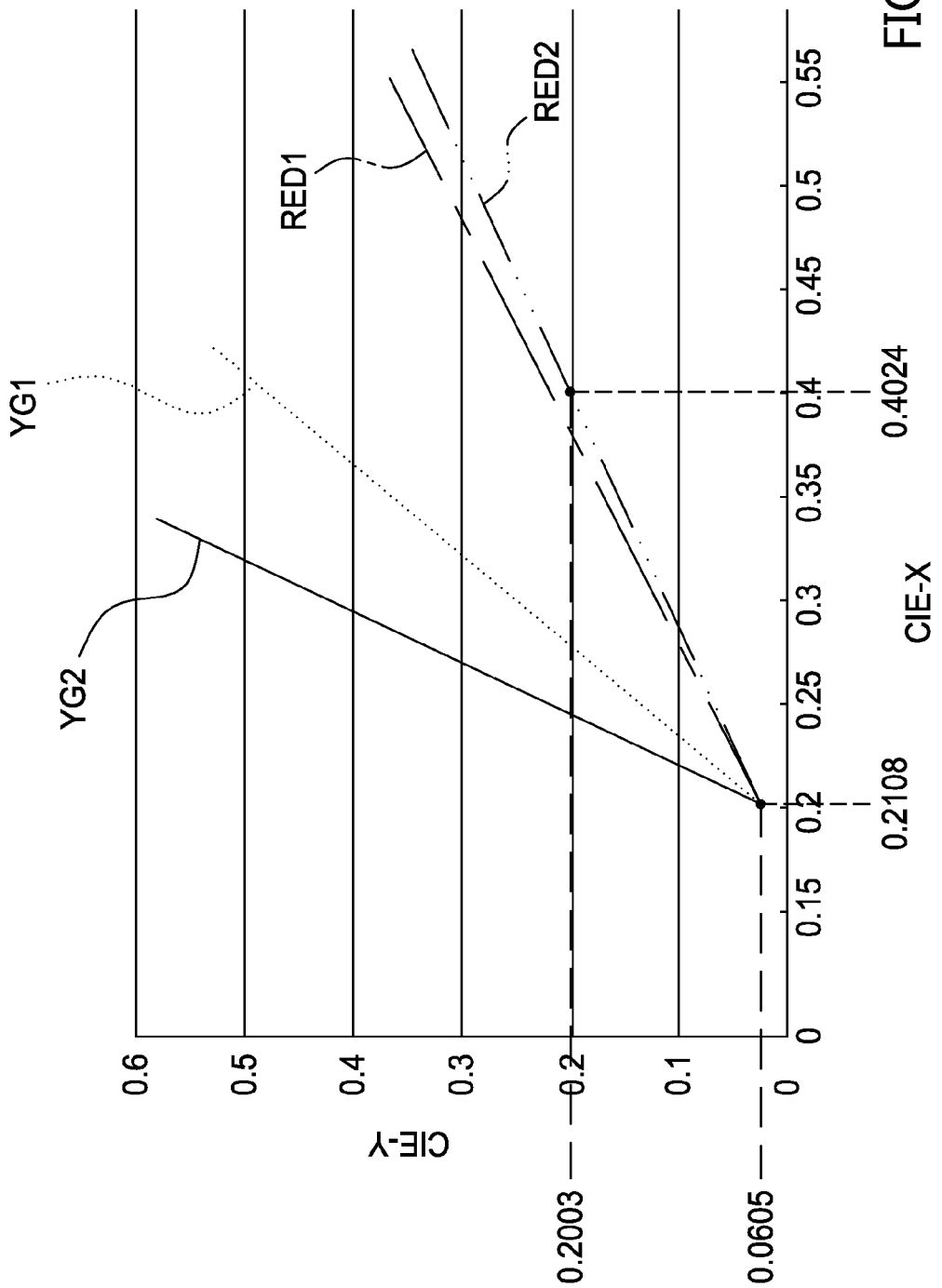

FIG. 2c shows the chromaticity coordinate relationship of the light from the red phosphor, the light from yellow-green phosphor and the light from LED chip from the embodiments disclosed in FIGS. 2a~2b. The inclined line RED1 and the inclined line RED2 respectively represent the boundary lines of the region where the second chromaticity coordinate of the fourth light mixed by the light from the red phosphor having a wavelength of 625~640 nm and a light from the blue LED chip locates. The two inclined lines RED1 and RED2 have a slope of 0.64 and a slope of 0.71 respectively. In this embodiment, the second chromaticity coordinate of the fourth light and the first chromaticity coordinate of the first light from the LED chip forms a line, and the slope of the line is changed according to the amount of the red phosphor on the LED chip but limited within a range formed by the inclined line RED1 and the inclined line RED2. In other words, the second chromaticity coordinate has an x coordinate between 0.2108~0.4024 and a y coordinate between 0.0605~0.2003. For example, the x coordinate can be 0.25, 0.3, 0.34 or 0.37, and the y coordinate can be 0.07, 0.1, 0.16 or 0.18. Therefore, the second chromaticity coordinate substantially locates within a range having an x coordinate of 0.31±32% and a y coordinate of 0.14±57%. In another embodiment, the second chromaticity coordinate has an x coordinate between 0.20~0.42 and a y coordinate between 0.055~0.25. For example, the x coordinate can be 0.205, 0.3, 0.34, 0.37 or 0.41, and the y coordinate can be 0.058, 0.16, 0.18, 0.21 or 0.24. That is, the second chromaticity coordinate substantially locates within a range having an x coordinate of 0.31±36% and a y coordinate of 0.15±68%.

The inclined line YG1 and the inclined line YG2 in FIG. 2c form a range representing the range of the slope of an inclined line consisted of the second chromaticity coordinate of the fourth light and the third chromaticity coordinate of the fifth light in accordance with the embodiments in FIGS. 2a~2b. That is, the second chromaticity coordinate and the third chromaticity coordinate form an inclined line having a slope, and the range of the slope is between the slope of the inclined line YG1 and the slope of the inclined line YG2. In this embodiment, the inclined line YG1 and the inclined line YG2 have a slope of 1.6 and 0.3 respectively. In this embodiment, the second chromaticity coordinate of the fourth light is affected by the amount of the yellow-green phosphor, and the slope of the line formed by the second chromaticity coordinate and the third chromaticity coordinate of the fifth light locates in a range formed by the inclined line YG1 and the inclined line YG2. Therefore, the third chromaticity coordinate has an x coordinate between 0.3028~0.4813 and a y coordinate between 0.3113~0.4319. For example, the x coordinate can be 0.32, 0.41 or 0.47, and the y coordinate can be 0.32, 0.35, 0.4 or 0.42. The third chromaticity coordinate substantially locates within a range having an x coordinate of 0.39±24% and a y coordinate of 0.37±19%. In this embodiment, a ratio between the area of the region where the second chromaticity coordinate locates and the area of the region where the third chromaticity coordinate locates is not less than 1.5.

To sum up, the relationship between the phosphor and the related chromaticity coordinate depicted in FIG. 2c can be applied to the process of forming phosphor on the LED chip to generate a desired white light. First, a coordinate of the first light emitted by the LED chip is determined. In this embodiment, the dominate wavelength of the first light is between 450~490 nm. Next, estimate a second chromaticity coordinate of the fourth light based on the range formed by the inclined line RED1 and the inclined line RED2 in FIG. 2c, and cover proper amount of red phosphor on the LED chip according to desired second chromaticity coordinate. After the second chromaticity coordinate is derived by covering proper amount of phosphor, covering proper amount of yellow-green phosphor to form a desired white light having a third chromaticity coordinate within the range formed by the inclined line YG1 and the inclined line YG2. Wherein, the adjustment of the second chromaticity coordinate and the adjustment of the third chromaticity coordinate are realized by covering a red phosphor and a yellow-green phosphor, and the amount of phosphors and/or the composition of the phosphors applied can be modified or chosen according to desired chromaticity coordinate.

In another embodiment, the compositions of the phosphors applied are different from the phosphor in the embodiments above. That is, the red phosphor applied in the previous embodiment emits a red light having a wavelength of 625 nm or a wavelength of 640 nm, and in another embodiment, the red phosphor emits a red light having a wavelength between 620~650 nm. The red phosphor in another embodiment can be made of same chemical elements but in different ratio compared with the red phosphor in previous embodiments, or the red phosphor has chemical element different from the red phosphor used in previous embodiment. Similarly, the yellow-green phosphor applied in the previous embodiment emits a yellow-green light having a dominate wavelength of 539 nm, and the yellow-green phosphor applied in another embodiment emits a yellow-green light having a wavelength between 500~570 nm. That is, the yellow-green phosphor in another embodiment has the same chemical elements but in different ratio compared with the yellow-green phosphor in previous embodiments, or the yellow-green phosphor used has another chemical element different from the yellow-green phosphor used in previous embodiment. As described above, the composition of the phosphor applied is not limited to the embodiments above; the red light emitted by the phosphor has a dominate wavelength between a range of the dominate wavelength (620~650 nm) of the red light in the embodiments above, and the yellow-green light emitted by the phosphor has a dominate wavelength between a range of the dominate wavelength (500~570 nm) of the yellow-green light in the embodiments above. Therefore, the yellow-green phosphor applied can be one yellow-green phosphor or a mixture of different kinds of yellow-green phosphors having same or different wavelengths, and the red phosphor applied can be one red phosphor or a mixture of different kinds of red phosphors having same or different wavelengths. Furthermore, the light emitted from the yellow-green phosphors has a dominate wavelength within a range of 500~570 nm, and the light emitted from the red phosphors has a dominate wavelength of 620~650 nm. Since the red phosphors applied in the embodiments are different from each other, the corresponding slopes of the inclined lines RED1 and RED2 in FIG. 2c are between 0.6~0.76. Similarly, the yellow-green phosphors applied in the embodiments are different from each other so the corresponding slopes of the inclined lines YG1 and YG2 in FIG. 2c are between 1.3~3.2.

Figure 3:
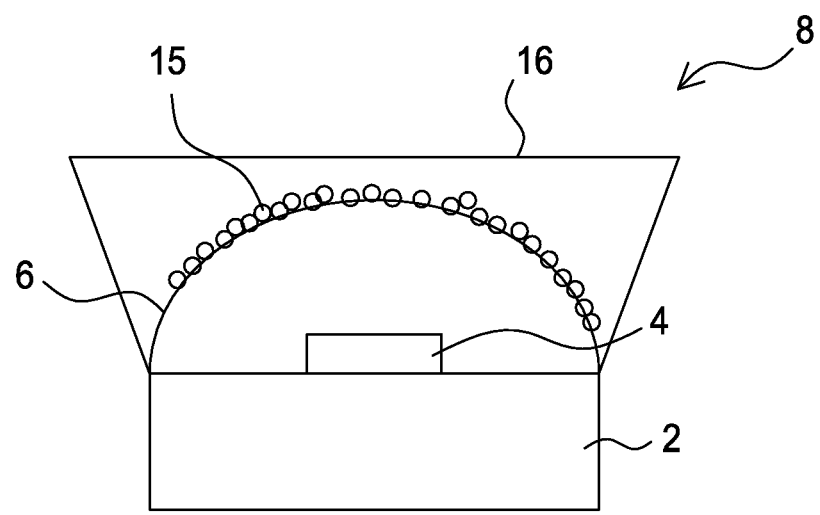
FIG. 3 shows a light-emitting element in accordance with an embodiment of the present disclosure.

FIG. 3 shows a cross-sectional view of an embodiment in accordance with this application. The light-emitting element 10 comprises a substrate 2, an LED chip 4 on the substrate 2, a first optical element 6 covering the LED chip 4, a second optical element 16 on the first optical element 6, and a wavelength conversion layer 15 between the first optical element 6 and the second optical element 16. The substrate 2 comprises a circuit electrically connected to the LED chip 4 so the LED chip 4 is electrically connected to the external power source. Moreover, the material of the substrate 2 can be high thermal conduction material, such as metal or ceramic which has a thermal conductivity larger than 30 W/m° C., and the substrate 2 is used to provide a heat dissipation path for LED chip 4. The first optical element 6 is composed of material transparent to the light emitted from the LED chip 4. The second optical element 16 is composed of a material transparent to the light emitted from the LED chip 4 and the light converted by the wavelength conversion layer 15. In this embodiment, the wavelength conversion layer 15 locates on the first optical element 6 and has a similar shape compared with the first optical element 6, and the wavelength conversion layer 15 is used to convert the light from LED 4 to be a first light. The shape of the first optical element can be arched, spherical, semi-spherical and so on to keep the light passing through the first optical element remain substantially an omni-directional light. Then, a second optical element 16 is applied to adjust the light field according requirement, and the shape of the second optical element 16 can be the same as, similar with or different from the shape of the first optical element 6. That is, the light field of a light passing through the first optical element 6 and the light field of the same light passing through the second optical element 16 can be same, similar or different according to different application. The converted light and the light from LED chip 4 are mixed to be a white light, and the wavelength conversion layer 15 comprises one wavelength conversion material, such as phosphor. In another embodiment, the phosphor conversion layer 15 comprises a transparent colloid and the wavelength conversion material spread uniformly on a surface of the first optical element 6. In another embodiment, one or more materials for scattering light, such as $TiO_2$, can be added into the wavelength conversion layer 15 to improve the luminance in all directions by scattering the light while passing through the wavelength conversion layer 15. The first light passing through the wavelength conversion layer 15 has a first color temperature and a first light pattern, and the second light passing through the second optical element 16 has a second color temperature and a second light pattern. The first color temperature and the second color temperature are substantially the same, and the first light pattern and the second light pattern can be the same or different from each other. In other words, the luminance of the second light measured in an angle corresponding to the LED chip 4 can be designed to be larger than, smaller than or equal to the luminance of the first light measured in a different angle according to different requirements.

In this embodiment, because the wavelength conversion layer 15 and the LED chip 4 are separated by a first optical element 6, the heat generated by the LED chip 4 while in operation is less likely to be conducted to the wavelength conversion layer 15 compared with another structure that the wavelength conversion layer 15 directly contact the LED chip 4, and the wavelength conversion characteristic of the wavelength conversion layer 15 is less likely to be affected. Therefore, the shift of the color temperature and/or the shift of the chromaticity coordinate of the white light results from variation of the wavelength conversion characteristic can be reduced. The second optical element 16 can be designed to have a different shape according to different requirements to provide a different light field. From manufacturing point of view, a substrate 2, an LED chip 4, a wavelength conversion layer 15 and a first optical element 6 can be combined to form a combination (ex. COB package or a chip on board package) first. Next, various second optical elements 16 of different shapes for different applications can be attached to the combination for final product. Thus, the procedure of manufacturing provides a benefit of assembly convenience for mass production and for application to different requirement.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting element, comprising:
   a semiconductor light-emitting stack for generating a first light in a wavelength of blue color which has a first chromaticity coordinate;
   a first wavelength conversion material formed on the semiconductor light-emitting stack and converting the first light to a second light; and
   a second wavelength conversion material formed on the first wavelength conversion material and converting the first light to a third light;
   wherein the first light and the second light are mixed to be a fourth light having a second chromaticity coordinate,
   wherein the third light and the fourth light are mixed to be a fifth light having a third chromaticity coordinate, and the second chromaticity coordinate locates at the top right of the first chromaticity coordinate and the third chromaticity coordinate locates at the top right of the second chromaticity coordinate, and
   wherein the second chromaticity coordinate is directed to a color temperature less than the first chromaticity coordinate.

2. The element of claim 1, wherein the second chromaticity coordinate locates within a first range of $(a_0 \times (1 \pm b_0 \%), c_0 \times (1 \pm d_0 \%))$, and $(a_0, b_0, c_0, d_0) = (0.31, 32, 0.14, 57)$.

3. The element of claim 1, wherein the third chromaticity coordinate locates within a second range of $(a \times (1 \pm b \%), c \times (1 \pm d \%))$, and $(a, b, c, d) = (0.39, 24, 0.37, 19)$.

4. The element of claim 1, wherein the fifth light has a color temperature between 2700 K ~6500K.

5. The element of claim 1, wherein the first chromaticity coordinate and the second chromaticity coordinate form a first line having a slope between 0.6~0.76.

6. The element of claim 1, wherein the second chromaticity coordinate and the third chromaticity coordinate form a second line having a slope between 1.3~3.2.

7. The element of claim 1, wherein the first light has a dominate wavelength within the wavelength range of 450 nm and about 490 nm, the second light has a dominate wavelength within the wavelength range of a red light, and the third light has a dominate wavelength within the wavelength range of a green light or a yellow light.

8. The element of claim 1, wherein the second light has a wavelength range between about 620 nm and about 650 nm.

9. The element of claim 1, wherein the third light has a wavelength range between about 500 nm and about 570 nm.

10. The element of claim 1, wherein the third chromaticity coordinate is directed to a color temperature greater than that of the second chromaticity coordinate.

11. A method of manufacturing a light-emitting element, comprising:
    providing a semiconductor light-emitting stack for generating a first light in a wavelength of blue color, and the first light has a first chromaticity coordinate;
    forming a first wavelength conversion material on the semiconductor light-emitting stack, and the first wavelength conversion material converts the first light to emit a second light; and
    forming a second wavelength conversion material on the first wavelength conversion material, and the second wavelength conversion material converts the first light to emit a third light;
    wherein the first light and the second light are mixed to be a fourth light having a second chromaticity coordinate,
    wherein the third light and the fourth light are mixed to be a fifth light having a third chromaticity coordinate, and the second chromaticity coordinate locates at the top right of the first chromaticity coordinate and the third chromaticity coordinate locates at the top right of the second chromaticity coordinate, and
    wherein the second chromaticity coordinate is directed to a color temperature less than the first chromaticity coordinate.

12. The method of claim 11, further comprising forming a plurality of layers of the first wavelength conversion materials on the semiconductor light-emitting stack.

13. The method of claim 11, wherein the second chromaticity coordinate locates within a first range and the third chromaticity coordinate locates within a second range, wherein an area ratio of the first range and the second range is not less than 1.5.

* * * * *